(12) United States Patent
Ishii

(10) Patent No.: US 9,447,767 B2
(45) Date of Patent: Sep. 20, 2016

(54) SINGLE CHIP IGNITER AND INTERNAL COMBUSTION ENGINE IGNITION DEVICE

(71) Applicant: FUJI ELECTRIC CO., LTD., Kawasaki-shi (JP)

(72) Inventor: Kenichi Ishii, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 23 days.

(21) Appl. No.: 13/933,864

(22) Filed: Jul. 2, 2013

(65) Prior Publication Data

US 2014/0015005 A1 Jan. 16, 2014

(30) Foreign Application Priority Data

Jul. 3, 2012 (JP) .................. 2012-149811
Jul. 3, 2012 (JP) .................. 2012-149812
Jul. 3, 2012 (JP) .................. 2012-149813

(51) Int. Cl.
*F02P 11/00* (2006.01)
*F02P 3/05* (2006.01)
(Continued)

(52) U.S. Cl.
CPC ............... *F02P 11/00* (2013.01); *F02P 3/05* (2013.01); *F02P 3/055* (2013.01); *H01L 27/0635* (2013.01)

(58) Field of Classification Search
CPC ...... F02P 3/0435; F02P 3/0453; F02P 3/055; F02P 11/06; F02P 11/025; F02P 11/00; F02P 3/04; F02P 3/05; F02P 3/0552; H01L 27/0635
USPC ................. 257/139, 401, 296; 123/630, 644
See application file for complete search history.

(56) References Cited

U.S. PATENT DOCUMENTS 3,660,773 A * 5/1972 Free ............................. 330/256
4,336,503 A * 6/1982 Whatley ....................... 330/253
(Continued)

FOREIGN PATENT DOCUMENTS

CN 101399265 A 4/2009
JP S50-4959 A 1/1975
(Continued)

OTHER PUBLICATIONS

Author—N/A; Datasheet of Ignition IGBT NGB8207N, NGB8207BN; Dec. 2011; Literature Distribution Center for ON Semiconductor; Publication Order No. NGB8207N/D; pp. 1-7.*
(Continued)

*Primary Examiner* — Alexander Sofocleous
*Assistant Examiner* — Pavel Ivanov
(74) *Attorney, Agent, or Firm* — Rossi, Kimms & McDowell LLP

(57) ABSTRACT

Aspects of the invention are directed to a single chip igniter such that it is possible to realize a reduction in operating voltage, an increase in noise tolerance, a reduction in size, and a reduction in cost. By reducing the gate threshold voltage of a MOS transistor, and reducing the operating voltages of a current limiter circuit, an overheat detector circuit, a timer circuit, an overvoltage protection circuit, an input hysteresis circuit, and the like, it is possible to reduce the operating voltage of a single chip igniter. In some aspects of the invention, the effective gate voltage of the MOS transistor is 1V or more, and the channel length of the MOS transistor is 4 μm or less. Also, in some aspects of the invention, the thickness of a gate oxide film of the MOS transistor is 5 nm or more, 25 nm or less.

37 Claims, 11 Drawing Sheets

(51) Int. Cl.
*F02P 3/055* (2006.01)
*H01L 27/06* (2006.01)

(56) References Cited

U.S. PATENT DOCUMENTS

| | | | | |
|---|---|---|---|---|
| 4,967,244 | A | * | 10/1990 | Bauer .......................... 257/140 |
| 5,581,131 | A | * | 12/1996 | Urushiwara ............ F02P 3/051 |
| | | | | 123/630 |
| 5,634,453 | A | * | 6/1997 | Taruya et al. ................. 123/645 |
| 5,664,550 | A | | 9/1997 | Ito et al. |
| 5,796,125 | A | * | 8/1998 | Matsudai et al. ............. 257/141 |
| 5,985,708 | A | | 11/1999 | Nakagawa et al. |
| 6,229,180 | B1 | | 5/2001 | Yoshida et al. |
| 6,894,319 | B2 | | 5/2005 | Kobayashi et al. |
| 7,368,825 | B2 | | 5/2008 | Kawamoto |
| 7,777,518 | B2 | | 8/2010 | Toyoda et al. |
| 8,006,678 | B2 | | 8/2011 | Naito et al. |
| 8,053,859 | B2 | | 11/2011 | Lu et al. |
| 2004/0011342 | A1 | * | 1/2004 | Fukatsu ........................ 123/630 |
| 2004/0113200 | A1 | * | 6/2004 | Kobayashi et al. .......... 257/328 |
| 2007/0235804 | A1 | * | 10/2007 | Watanabe et al. ............ 257/347 |
| 2009/0085060 | A1 | * | 4/2009 | Yamagiwa et al. ........... 257/139 |
| 2010/0059028 | A1 | * | 3/2010 | Ueno ............................ 123/652 |
| 2012/0193643 | A1 | * | 8/2012 | Masuda et al. ................. 257/77 |

FOREIGN PATENT DOCUMENTS

| | | |
|---|---|---|
| JP | H9-177647 A | 7/1997 |
| JP | H10-313116 A | 11/1998 |
| JP | 3192074 B2 | 5/2001 |
| JP | 3216972 B2 | 8/2001 |
| JP | 2003-008014 A | 1/2003 |
| JP | 2005-327952 A | 11/2005 |
| JP | 2005-347771 A | 12/2005 |
| JP | 2008-532257 A | 8/2008 |
| JP | 2009-138547 A | 6/2009 |
| JP | 2009284420 A | 12/2009 |
| JP | 2010-45141 A1 | 2/2010 |

OTHER PUBLICATIONS

Official Action issued in Chinese Appln. No. 201310276948.5 mailed Mar. 2, 2016. Partial English translation provided.
Office Action issued in Japanese Application No. JP2012-149813 mailed Jun. 21, 2016. English translation provided.
Office Action issued in Japanese Application No. JP2012-149811 mailed Jun. 21, 2016. English translation provided.
Office Action issued in Japanese Application No. JP2012-149812 mailed Jun. 21, 2016. English translation provided.

* cited by examiner

SINGLE CHIP IGNITER AND INTERNAL COMBUSTION ENGINE IGNITION DEVICE

BACKGROUND OF THE INVENTION

1. Field of the Invention

Embodiments of the invention relate to low voltage drive single chip igniters, and to internal combustion engine ignition devices that include single chip igniters.

2. Description of Related Art

FIG. 8 is a main portion configuration diagram of an internal combustion engine ignition device 500 in which is mounted a heretofore known single chip igniter 501.

The internal combustion engine ignition device 500 is configured mainly of the single chip igniter 501, an ignition coil 502, a spark plug 503, a battery 504, and an engine control unit (ECU) 505. Of the reference signs in the diagram, 75, 76, and 77 are a collector terminal, a gate terminal, and an emitter terminal of the single chip igniter 501. Also, 51 is an IGBT including a sense IGBT, and 56 is a sense resistor.

FIG. 9 is a main portion circuit diagram of the heretofore known single chip igniter 501 mounted in the internal combustion engine ignition device 500 shown in FIG. 8. The single chip igniter 501 shown here is one example.

The single chip igniter 501 is configured of the IGBT 51, a first MOSFET 63, a second MOSFET 66, a current limiter circuit 57, an overheat detector circuit 60, a Zener diode 69, a resistor 72, the collector terminal 75, the gate terminal 76, and the emitter terminal 77. A collector 52 of the IGBT 51 is connected to the collector terminal 75, and an emitter 54 is connected to the emitter terminal 77. A sense emitter 55 of the IGBT 51 is connected to one end of the sense resistor 56, the other end of the sense resistor 56 is connected to ground wiring 74, and the ground wiring 74 is connected to the emitter terminal 77, which is a ground potential 78. A gate 53 of the IGBT 51 is connected via gate wiring 73 to the gate terminal 76. Each of the current limiter circuit 57, overheat detector circuit 60, first MOSFET 63, second MOSFET 66, Zener diode 69, and resistor 72 is connected between the gate wiring 73 and ground wiring 74. The overheat detector circuit 60 is configured of a MOSFET (A), a diode (B), and an inverter circuit (C), as shown in the diagram. Also, as well as the previously mentioned parts, a speed-up diode (D) for speeding up the turning off of the IGBT 51 is connected between the cathode of the Zener diode 69 and the source of the second MOSFET 66, and a Zener diode (F) for surge protection is connected between the collector 52 and gate 53. Also, surge protection resistors (E) are inserted in the gate wiring 73 between the resistor 72 and Zener diode 69, and between the high potential side of the current limiter circuit 57 and the drain of the second MOSFET 66. Each region is formed on one semiconductor substrate 81.

One end of the sense resistor 56 and a gate 64 of the first MOSFET 63 are connected to the current limiter circuit 57, while a gate 67 of the second MOSFET 66 is connected to the overheat detector circuit 60. The output voltage of the ECU 505 is input into the gate terminal 76 as the gate voltage of the IGBT 51. The gate voltage is supplied via the gate wiring 73 to the current limiter circuit 57 and overheat detector circuit 60, becoming a power supply voltage that drives the circuits 57 and 60.

The IGBT 51, first and second MOSFETs 63 and 66, current limiter circuit 57, overheat detector circuit 60, resistor 72, Zener diode 69, collector terminal 75, emitter terminal 77, and gate terminal 76 are formed on the same semiconductor substrate 81, thereby configuring the single chip igniter 501. The current limiter circuit 57 is formed of an operational amplifier configured of a three-stage n-type MOS. Also, the Zener diode 69 and resistor 72 are surge protection elements that suppress surge voltage entering from the gate terminal 76.

Also, the minimum operating voltage of the single chip igniter 501 is 3.5V, while the minimum operating voltage of each of the IGBT 51, current limiter circuit 57, and overheat detector circuit 60 configuring the single chip igniter 501 is 3.5V or less. Herein, the minimum operating voltage of the IGBT 51 indicates the gate threshold voltage of the IGBT 51. Also, the voltage value "3.5V" is the minimum voltage value of an ECU signal giving an operation command to the single chip igniter.

FIG. 10 is an external view of the single chip igniter 501 of FIG. 9. A chip (the semiconductor substrate 81) mounted on a lead frame die 80 (connected to a collector terminal C, which is one of external lead-out terminals 82) and external lead-out terminals 82 (a gate terminal G and an emitter terminal E) are connected with bonding wire 83, and packaged using mold resin 84.

Next, a description will be given of an operation of the internal combustion engine ignition device 500 shown in FIG. 8.

When an output signal from the ECU 505 is input as an input signal (IGBT gate signal) into the gate terminal 76 of the single chip igniter 501, the input signal is input via the gate wiring 73 into the gate of the IGBT 51, and the IGBT 51 is turned on. On the IGBT 51 being turned on, current flows from the positive electrode of the battery 504 via the ignition coil 502 and IGBT 51 to the emitter terminal 77, which is at ground potential.

Meanwhile, when the output signal from the ECU 505 stops, the IGBT 51 is turned off. The instant the IGBT 51 is turned off, energy accumulated in the ignition coil 502 is released, a high voltage is generated in the ignition coil 502, and the spark plug 503 ignites. Subsequently, when the energy accumulated in the ignition coil 502 is dissipated, the arc of the spark plug 503 is extinguished. By this operation being repeated, the internal combustion engine ignition device 500 continues to operate. Next, a description will be given using FIG. 9.

When an overcurrent flows through the IGBT 51, voltage is generated in the sense resistor 56 by a sense current flowing through the sense emitter 55 and sense resistor 56. The voltage is transmitted to the current limiter circuit 57, and the current limiter circuit 57 operates. A gate signal is sent from the current limiter circuit 57 to the first MOSFET 63, and the first MOSFET 63 is turned on. On the first MOSFET 63 being turned on, the gate voltage of the IGBT 51 is squeezed and decreases. When the gate voltage of the IGBT 51 decreases, dropping to or below the gate threshold voltage of the IGBT 51, the IGBT 51 is turned off, the overcurrent is cut off, and the IGBT 51 is protected.

Meanwhile, when the IGBT 51 overheats, the overheat detector circuit 60 operates and the IGBT 51 is turned off, in the same way as when there is an overcurrent. By the IGBT 51 being turned off, the main current flowing through the IGBT 51 is cut off, and the IGBT 51 is protected. When the IGBT 51 overheats, the forward voltage drop value of an unshown temperature detection p-n diode formed in the IGBT 51 decreases. The forward voltage drop value (voltage) is input into the overheat detector circuit 60 and, at the point at which the forward voltage drop value drops to or below a limit value, a turn-on signal is sent from the overheat detector circuit 60 to the gate of the second MOSFET 66, and the second MOSFET 66 is turned on. The subsequent operation is the same as in the case of the current limiter circuit 57. The overheat detector circuit 60 and current limiter circuit 57 both function as control circuits that control the gate voltage of the IGBT 51.

As the single chip igniter 501 is used in the internal combustion engine ignition device 500, the usage environment is extremely harsh. To give a specific description, the IGBT 51 should not destruct even when a surge voltage of 30 kV is applied between the collector terminal 75 and emitter terminal 77, and the IGBT 51 should operate normally (this means that a parasitic element does not operate) in a temperature range of, for example, −55° C. to 205° C. In order for the single chip igniter 501 to operate normally even under these harsh conditions, the current limiter circuit 57 and overheat detector circuit 60 are configured of only an n-type MOS. This is because the process is complex when a p-type MOS and n-type MOS exist together, leading to a rise in cost. Also, when adopting a hybrid circuit (a complementary circuit, or the like) of a p-type MOS and n-type MOS, a parasitic element is formed between the two, and a parasitic operation (a malfunction) is liable to occur.

Japanese Patent No. 3,192,074 discloses a single chip igniter in an internal combustion engine ignition device including a switching element that controls the conduction and cutting off of a primary current flowing through an ignition coil in response to an ignition control signal output from an internal combustion engine electronic control device, and a current limiter circuit that limits the current flowing through the switching element, the switching element being configured of an insulated gate bipolar transistor, wherein the current limiter circuit is configured of a self-isolating n-type MOS transistor, and the insulated gate bipolar transistor and self-isolating n-type MOS transistor are formed on the same semiconductor substrate, thereby forming a single chip. That is, Japanese Patent No. 3,192,074 discloses a single chip igniter wherein a current limiter circuit is configured of a self-isolating n-type MOS transistor (an n-type MOS) and formed on the same semiconductor substrate as an IGBT.

Also, Japanese Patent No. 3,216,972 discloses a single chip igniter in an internal combustion engine ignition device that includes a first IGBT, and controls the conduction and cutting off of a primary current flowing through a primary coil with the first IGBT in response to an ignition control signal, thereby generating voltage on a secondary side thereof, the single chip igniter including a second IGBT provided in parallel with the first IGBT, a current detector circuit that detects the current of the second IGBT, a current limiter circuit that controls the gate voltages of the first and second IGBTs in accordance with the current value detected by the current detector circuit, thereby limiting the primary current to a setting value, and a thermal cut-off circuit that forcibly cuts off the conduction of the current flowing through the primary coil when a problem occurs, wherein the circuits are configured collected on one chip.

Also, in JP-A-2010-45141, an IGBT that intermits a low voltage current flowing through a primary side coil, a fixed voltage circuit between an external gate terminal and an external collector terminal, and a protection Zener diode are included in an internal combustion engine ignition device. The fixed voltage circuit supplies to the IGBT a certain gate voltage such that a saturated current value of the IGBT reaches a predetermined limit current value. The IGBT is such that the saturated current value is in the range of the limit current value of a semiconductor device. A plurality of depression MOSFETs connected in parallel and a Zener diode are connected in series in the fixed voltage circuit. A selector switch is connected to each depression MOSFET, and all the selector switches are connected to a selector circuit. Further, when shipping from the factory, voltage fluctuation caused by electrical characteristics in the semiconductor device manufacture is adjusted by carrying out a turning on and off of the selector switches using the selector circuit. By so doing, oscillation in the waveform of the current flowing through the IGBT is suppressed. JP-A-2010-45141 discloses that a reduction in the overall size of the semiconductor device is achieved, and cost is reduced. A trench gate IGBT and a planar gate IGBT are described as the semiconductor device used here.

The collector terminal 75 of the single chip igniter 501 is connected to the battery 504 via an internal resistor of the ignition coil 502, and the emitter terminal 77 is connected to, for example, an engine room chassis, which is at the ground potential 78. Because of this, the potentials of the terminals 75 and 77 are comparatively stable.

As opposed to this, the potential of the gate terminal 76 is a low potential determined by the low output voltage (5V) of the ECU 505 and the small gate capacitance of the IGBT 51. Also, as an ignition pulse (several tens of kilovolts) is generated in the immediate vicinity of the single chip igniter 501, there is concern that the single chip igniter 501 will malfunction due to noise, and the output voltage of the ECU 505 may decrease due to noise. Furthermore, when the IGBT 51 is conductive, voltage is generated by the product of the resistance of ground wiring, such as a harness, and the conduction current, and it may happen that the ground potential 78 of the single chip igniter 501 rises (the ground floats) due to the voltage. Specifically, for example, when the rated conduction current of the IGBT is 10 A, and the resistance of a harness type of ground wiring between the IGBT and ECU and the ground is, on the high side, 0.1Ω, the product of the resistance and the conduction current reaches 1V, and this 1V is the rise (ground floating) of the ground potential. When ground floating occurs, it may happen that the voltage (gate signal voltage) between the gate terminal 76 of the single chip igniter 501 and the emitter terminal 77, which is at the ground potential 78, drops to 3.5V or less, and the operation of the single chip igniter 501 becomes unstable.

Next, a description will be given of heretofore known technology for combating voltage drop.

FIG. 11 is a main portion configuration diagram of a hybrid igniter 600. The hybrid igniter 600 includes an IGBT 51a and an IGBT drive circuit 90, and a current limiter circuit, an overheat detector circuit, and a sense resistor 56a are included in the IGBT drive circuit 90. Each of these parts is fixed on a printed substrate 91, a ceramic substrate, or the like.

It may happen that the output voltage from the ECU 505 drops below 3.5V due to noise, or the like, or that ground floating occurs, and the voltage between the gate and emitter of the IGBT 51a drops below 3.5V. At this time, it is necessary to compensate for the voltage drop, and constantly maintain the voltage between the gate and emitter of the IGBT 51a at or above 3.5V. When depressing noise is superimposed on the input voltage (gate voltage) input from the ECU 505, or when ground floating occurs, the IGBT drive circuit 90 has a function of compensating for the noise or the floating, and transmitting the regular gate voltage to the gate of the IGBT 51a.

The configuration of the hybrid igniter 600 of FIG. 11 is such that it is necessary for a large number of individual parts to be mounted on the printed substrate 91, or the like, and the number of parts increases. Because of this, the external dimensions increase, and the manufacturing cost increases.

Also, in Japanese Patent No. 3,192,074, Japanese Patent No. 3,216,972, and JP-A-2010-45141, no description is found suggesting a measure for reducing the operating voltage of a single chip igniter used in an internal combustion engine ignition device, which is the point of the invention. Thus, as is described above, there is a need in the art for an improved igniter.

SUMMARY OF THE INVENTION

Embodiments of the invention address this and other needs. Embodiments of the invention provide a single chip igniter, and an internal combustion engine ignition device including the single chip igniter, such that it is possible to realize a reduction in operating voltage, an increase in noise tolerance, an increase in surge resistance, a reduction in size, and a reduction in cost, thereby solving the heretofore described problems.

According to a first aspect of the invention, it is good to adopt a configuration such that, in a single chip igniter wherein a MOS transistor, a gate terminal electrically connected to the gate of the MOS transistor, and a control circuit that limits the gate voltage of the MOS transistor are disposed on the same semiconductor substrate, an input voltage input into the gate terminal of the single chip igniter becomes the power supply voltage of the control circuit and a control signal of the MOS transistor, and the minimum value of the input voltage is less than 3.5V.

Also, according to a second aspect of the invention, the first aspect of the invention is such that the minimum value of the input voltage is less than 2.5V.

Also, according to a third aspect of the invention, the first aspect of the invention is such that the minimum value of the input voltage is less than 2.0V.

Also, according to a fourth aspect of the invention, the first aspect of the invention is such that the effective gate threshold voltage of the MOS transistor configuring the single chip igniter is 1V or more, and the impurity dose per unit volume of a channel region of the MOS transistor is $1 \times 10^{17}/cm^3$ or less.

Also, according to a fifth aspect of the invention, the first aspect of the invention is such that the effective gate threshold voltage of the MOS transistor configuring the single chip igniter is 1V or more, and the channel length of the MOS transistor is 4 μm or less.

Also, according to a sixth aspect of the invention, the first aspect of the invention is such that when the channel length of the MOS transistor configuring the single chip igniter is L (cm) and the impurity concentration per unit volume of the channel region of the MOS transistor is N ($cm^{-3}$), $L \leq 4 \times 10^{-4} \times (10^{-17})^{1/3} \times N^{1/3}$.

Also, according to a seventh aspect of the invention, the first aspect of the invention is such that the effective gate threshold voltage of the MOS transistor configuring the single chip igniter is 1V or more, and the thickness of a gate oxide film of the MOS transistor is 5 nm or more, 25 nm or less.

Also, according to an eighth aspect of the invention, the first aspect of the invention is such that the effective gate threshold voltage of the MOS transistor configuring the single chip igniter is 1V or more and, when a cell of the MOS transistor is of a stripe form, the number of cells in a perpendicular direction per 1 cm in the longitudinal direction of the stripe form cell is $5 \times 10^2$ or more.

Also, according to a ninth aspect of the invention, the first aspect of the invention is such that the MOS transistor configuring the single chip igniter is of a planar gate structure or a trench structure.

Also, according to a tenth aspect of the invention, the first aspect of the invention is such that the control circuit is one or a plurality of circuits selected from a current limiter circuit, an overheat detector circuit, a timer circuit, an overvoltage protection circuit, and an input hysteresis circuit.

Also, according to an eleventh aspect of the invention, the first aspect of the invention is such that the MOS transistor is an insulated gate bipolar transistor.

Also, according to a twelfth aspect of the invention, an internal combustion engine ignition device uses the single chip igniter according to the first aspect of the invention.

In order to achieve the object, according to a thirteenth aspect of the invention, a configuration such that, in a single chip igniter wherein a MOS transistor, a gate terminal electrically connected to the gate of the MOS transistor, and a control circuit that limits the gate voltage of the MOS transistor are disposed on the same semiconductor substrate, an input voltage input into the gate terminal of the single chip igniter becomes the power supply voltage of the control circuit and a control signal of the MOS transistor, the minimum value of the input voltage is less than 3.5V, the minimum operating voltage of the control circuit is 1.5V or less, and the control circuit is configured of two inverter circuits configured of a serially connected two-stage MOSFET connected in series.

Also, according to a fourteenth aspect of the invention, the thirteenth aspect of the invention is such that the minimum value of the input voltage is less than 2.5V.

Also, according to a fifteenth aspect of the invention, the thirteenth aspect of the invention is such that the minimum value of the input voltage is less than 2.0V.

Also, according to a sixteenth aspect of the invention, the thirteenth aspect of the invention is such that the effective gate threshold voltage of the MOS transistor configuring the single chip igniter is 1V or more, and the impurity dose per unit volume of a channel region of the MOS transistor is $1 \times 10^{17}/cm^3$ or less.

Also, according to a seventeenth aspect of the invention, the thirteenth aspect of the invention is such that the effective gate threshold voltage of the MOS transistor configuring the single chip igniter is 1V or more, and the channel length of the MOS transistor is 4 μm or less.

Also, according to an eighteenth aspect of the invention, the thirteenth aspect of the invention is such that when the channel length of the MOS transistor configuring the single chip igniter is L (cm) and the impurity concentration per unit volume of the channel region of the MOS transistor is N ($cm^{-3}$), $L \leq 4 \times 10^{-4} \times (10^{-17})^{1/3} \times N^{1/3}$.

Also, according to a nineteenth aspect of the invention, the thirteenth aspect of the invention is such that the effective gate threshold voltage of the MOS transistor configuring the single chip igniter is 1V or more, and the thickness of a gate oxide film of the MOS transistor is 5 nm or more, 25 nm or less.

Also, according to a twentieth aspect of the invention, the thirteenth aspect of the invention is such that the effective gate threshold voltage of the MOS transistor configuring the single chip igniter is 1V or more and, when a cell of the MOS transistor is of a stripe form, the number of cells in a perpendicular direction per 1 cm in the longitudinal direction of the stripe form cell is $5 \times 10^2$ or more.

Also, according to a twenty-first aspect of the invention, the thirteenth aspect of the invention is such that the MOS transistor configuring the single chip igniter is of a planar gate structure or a trench structure.

Also, according to a twenty-second aspect of the invention, the thirteenth aspect of the invention is such that the minimum operating voltage of the control circuit is 1V or more, and the overheat detector circuit is configured of a two-stage inverter circuit.

Also, according to a twenty-third aspect of the invention, the thirteenth aspect of the invention is such that the control circuit is one or a plurality of circuits selected from a current limiter circuit, an overheat detector circuit, a timer circuit, an overvoltage protection circuit, and an input hysteresis circuit.

Also, according to a twenty-fourth aspect of the invention, the thirteenth aspect of the invention is such that the MOS transistor is an insulated gate bipolar transistor.

Also, according to a twenty-fifth aspect of the invention, an internal combustion engine ignition device uses the single chip igniter according to the thirteenth aspect of the invention.

In order to achieve the object, according to a twenty-sixth aspect of the invention, a configuration such that, in a single chip igniter wherein a MOS transistor, a gate terminal electrically connected to the gate of the MOS transistor, and a control circuit that limits the gate voltage of the MOS transistor are disposed on the same semiconductor substrate, an input voltage input into the gate terminal of the single chip igniter becomes the power supply voltage of the control circuit and a control signal of the MOS transistor, the minimum value of the input voltage is less than 3.5V, and a capacitor is connected between gate wiring connecting the gate terminal configuring the single chip igniter and the gate of the MOS transistor and the ground.

Also, according to a twenty-seventh aspect of the invention, the twenty-sixth aspect of the invention is such that the minimum value of the input voltage is less than 2.5V.

Also, according to a twenty-eighth aspect of the invention, the twenty-sixth aspect of the invention is such that the minimum value of the input voltage is less than 2.0V.

Also, according to a twenty-ninth aspect of the invention, the twenty-sixth aspect of the invention is such that the effective gate threshold voltage of the MOS transistor configuring the single chip igniter is 1V or more, and the impurity dose per unit volume of a channel region of the MOS transistor is $1 \times 10^{17}/cm^3$ or less.

Also, according to a thirtieth aspect of the invention, the twenty-sixth aspect of the invention is such that the effective gate threshold voltage of the MOS transistor configuring the single chip igniter is 1V or more, and the channel length of the MOS transistor is 4 μm or less.

Also, according to a thirty-first aspect of the invention, the twenty-sixth aspect of the invention is such that when the channel length of the MOS transistor configuring the single chip igniter is L (cm) and the impurity concentration per unit volume of the channel region of the MOS transistor is N (cm$^{-3}$), $L \leq 4 \times 10^{-4} \times (10^{-17})^{1/3} \times N^{1/3}$.

Also, according to a thirty-second aspect of the invention, the twenty-sixth aspect of the invention is such that the effective gate threshold voltage of the MOS transistor configuring the single chip igniter is 1V or more, and the thickness of a gate oxide film of the MOS transistor is 5 nm or more, 25 nm or less.

Also, according to a thirty-third aspect of the invention, the twenty-sixth aspect of the invention is such that the effective gate threshold voltage of the MOS transistor configuring the single chip igniter is 1V or more and, when a cell of the MOS transistor is of a stripe form, the number of cells in a perpendicular direction per 1 cm (cell density) in the longitudinal direction of the stripe form cell is $5 \times 10^2$ or more.

Also, according to a thirty-fourth aspect of the invention, the twenty-sixth aspect of the invention is such that the MOS transistor configuring the single chip igniter is of a planar gate structure or a trench structure.

Also, according to a thirty-fifth aspect of the invention, the twenty-sixth aspect of the invention is such that capacitors are connected between the high potential side of the control circuit power supply and the ground.

Also, according to a thirty-sixth aspect of the invention, the twenty-sixth aspect of the invention is such that the minimum operating voltage of the control circuit is 1V or more, and the control circuit is configured of an inverter circuit configured of a serially connected two-stage MOSFET.

Also, according to a thirty-seventh aspect of the invention, the twenty-sixth aspect of the invention is such that the control circuit is a current limiter circuit, an overheat detector circuit, or both the current limiter circuit and the overheat detector circuit.

Also, according to a thirty-eighth aspect of the invention, the twenty-sixth aspect of the invention is such that the MOS transistor is an insulated gate bipolar transistor.

Also, according to a thirty-ninth aspect of the invention, an internal combustion engine ignition device uses the single chip igniter according to the twenty-sixth aspect of the invention.

According to some embodiments of the invention, by the gate threshold voltage of an MOS transistor being a low voltage (1.5V or less) and the operating voltages of a current limiter circuit and overheat detector circuit being low voltages (1V or more), it is possible to reduce the operating voltage (1V to less than 3.5V) of a single chip igniter used in an internal combustion engine ignition device.

Also, by inserting a capacitor between gate wiring connecting a gate terminal and MOS transistor gate and ground wiring, it is possible to increase noise tolerance and surge tolerance.

Also, by configuring the current limiter circuit and overheat detector circuit of two-stage inverter circuits, it is possible to reduce the operating voltages of the circuits.

Also, as, in some embodiments, no voltage converter circuit is provided, it is possible to reduce the package size and reduce the cost in comparison with a hybrid igniter.

BRIEF DESCRIPTION OF THE DRAWINGS

FIG. 6A shows a configuration of a heretofore known example relating to a control circuit, while

DETAILED DESCRIPTION

Embodiments of the invention are directed to a single chip igniter configuring an internal combustion engine ignition device such that driving is possible as far as an input voltage (gate voltage: 1V to less than 3.5V) lower than an input voltage (gate voltage: 3.5V to 5V) input from a heretofore known gate terminal.

Measures for this include the following three points: 1) reducing the gate threshold of a MOS transistor, 2) reducing the operating voltage of a current limiter circuit and an overheat detector circuit, and 3) implementing a countermeasure against noise, which becomes more liable to be affected when the operating voltage is reduced. In the case of some embodiments of the invention, the measure is that the minimum operating voltage of a single chip igniter is 1V or in the vicinity of a voltage exceeding that (1V to less than 3.5V). Because of this, it is necessary for a gate threshold voltage Vgth of the MOS transistor, the minimum operating voltage of the current limiter circuit, and the minimum operating voltage of the overheat detector circuit to be 1V. That is, the operating voltage of the single chip igniter of the invention is a voltage within a range of 1V to 5V. Next, the previously mentioned points will be described sequentially in the following embodiments.

Embodiment 1

IGBT

Figure 1:
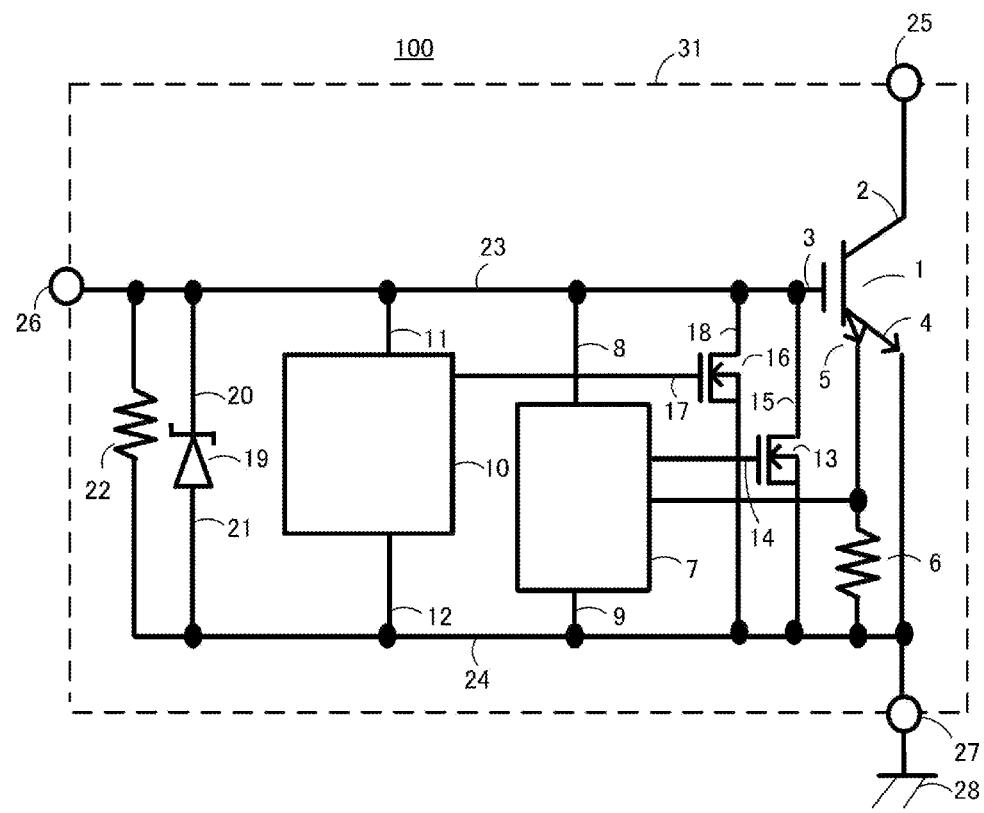
FIG. 1 is a configuration diagram of a single chip igniter used in an internal combustion engine ignition device according to a first embodiment of the invention.
Figure 2A:
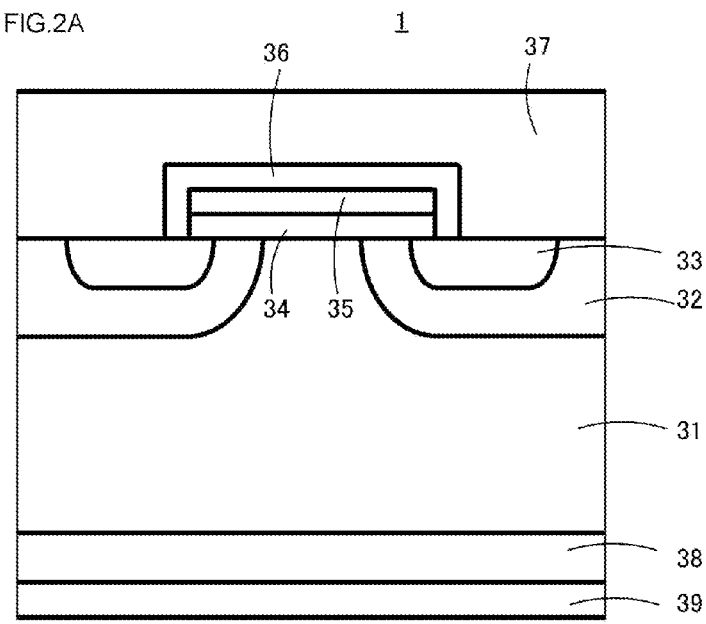
FIGS. 2A to 2C are main portion sectional views of the IGBT formed on the semiconductor substrate in the single chip igniter used in the internal combustion engine ignition device according to the first embodiment of the invention.

FIG. 1 is a configuration diagram of a single chip igniter 100 used in an internal combustion engine ignition device according to a first embodiment of the invention, wherein FIG. 1 is an overall circuit configuration diagram, while FIG. 2A is a main portion sectional view of an IGBT 1 formed on a semiconductor substrate 31. FIG. 2A shows a main portion sectional view of one cell. Also, although the gate structure of the IGBT 1 is shown here as a planar type, it may also be an unshown trench type. Also, although the IGBT 1 is given as an example of a power device in FIG. 1, it may also be a power MOSFET. As a power MOSFET, it is good to use one in which a sense source corresponding to a sense emitter 4 is formed.

In FIG. 1, the single chip igniter 100 is configured of the IGBT 1 having a sense emitter 5, a sense resistor 6, a current limiter circuit 7, an overheat detector circuit 10, a surge protection Zener diode 19 and resistor 22, a first MOSFET 13, a second MOSFET 16, a collector terminal 25, a gate terminal 26, and an emitter terminal 27. Although not shown here, the circuit configuration of the overheat detector circuit 10 is the same as the circuit configuration of a heretofore known overheat detector circuit 60.

A collector 2 of the IGBT 1 is connected to the collector terminal 25 of the single chip igniter 100, a gate 3 is connected to the gate terminal 26, and an emitter 4 is connected to the emitter terminal 27. The sense emitter 5 is connected to the sense resistor 6, and the gate 3 of the IGBT 1 and the gate terminal 26 are connected to gate wiring 23. A high potential side 8 of the current limiter circuit 7 is connected to the gate wiring 23, forming the power supply of the current limiter circuit 7. Also, a high potential side 11 of the overheat detector circuit 10 is connected to the gate wiring 23, forming the power supply of the overheat detector circuit 10. Also, a low potential side 9 of the current limiter circuit 7 and a low potential side 12 of the overheat detector circuit 10 are connected to ground wiring 24. Also, a drain 15 of the first MOSFET 13 and a drain 18 of the second MOSFET 16 are connected to the gate wiring 23, and the source of each is connected to the ground wiring 24. Also, a cathode 20 of the Zener diode 19 for counteracting surge is connected to the gate wiring 23, while an anode 21 is connected to the ground wiring 24. Furthermore, the resistor 22 for counteracting surge is connected between the gate wiring 23 and ground wiring 24. Also, the ground wiring 24 forms a ground potential 28 via the emitter terminal 27. Voltage generated in the sense resistor 6 is input into the current limiter circuit 7. An output signal of the current limiter circuit 7 is input into a gate 14 of the first MOSFET 13. Each of the heretofore described regions is formed on the same semiconductor substrate 31. Also, a plurality of the Zener diode 19 may be arranged in series.

Figure 9:
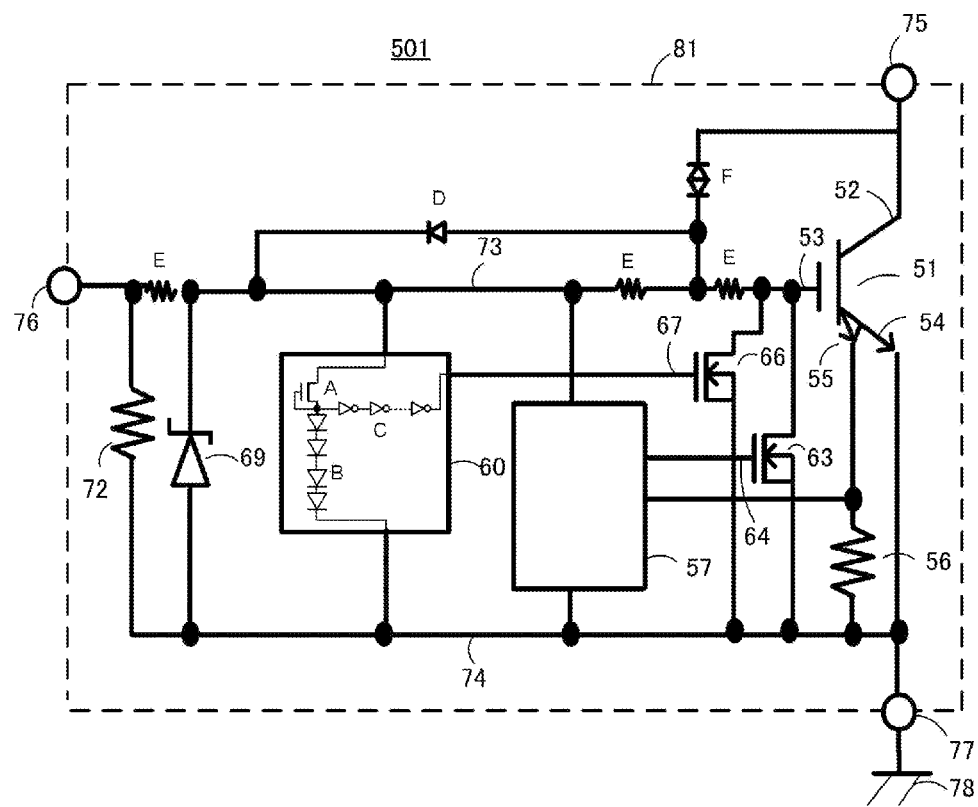
FIG. 9 is a main portion circuit diagram of the heretofore known single chip igniter mounted in the internal combustion engine ignition device shown in FIG. 8.
Figure 10:
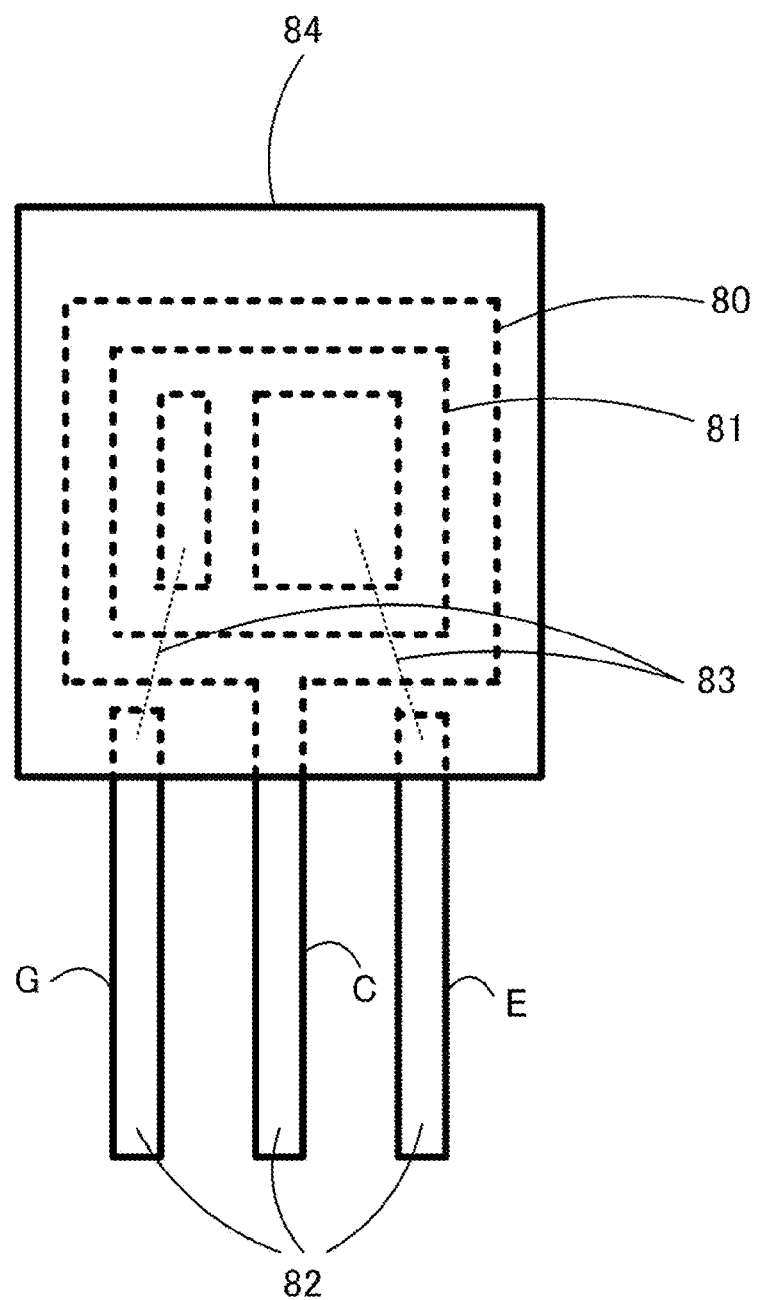
FIG. 10 is an external view of the single chip igniter of FIG. 9.
Figure 11:
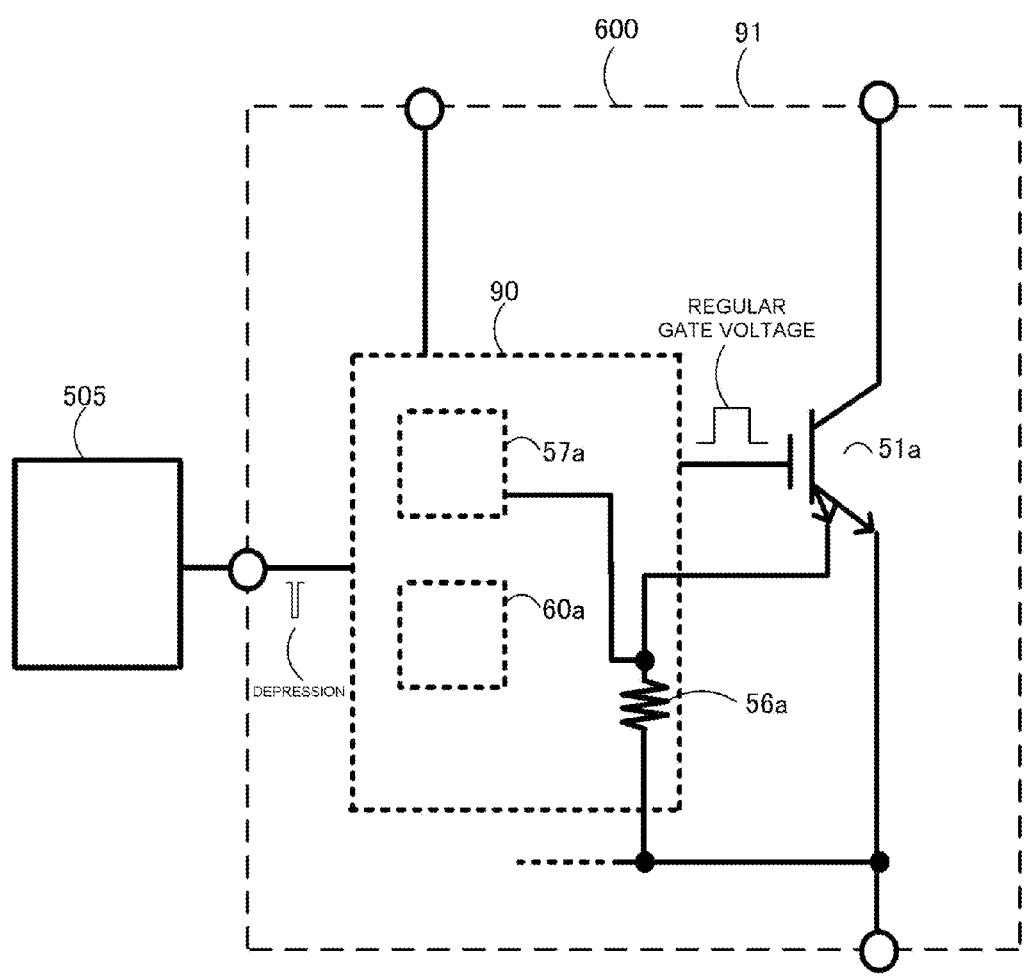
FIG. 11 is a main portion configuration diagram of a hybrid igniter.

Also, the circuit of FIG. 1 is such that as well as the heretofore described parts, although not shown, a diode is connected for surge protection between the cathode of the Zener diode 19 and the source of the second MOSFET 16, and a Zener diode is connected for surge protection between the collector 2 and gate 3, in the same way as in the circuit of FIG. 9. Furthermore, resistance is inserted for surge protection in the gate wiring 23 between the resistor 22 and Zener diode 19 and between the high potential side of the current limiter circuit 7 and the drain of the second MOSFET 16.

Figure 2B:
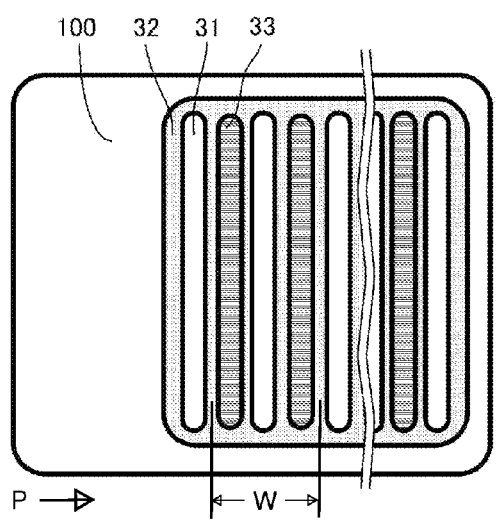
Figure 2C:
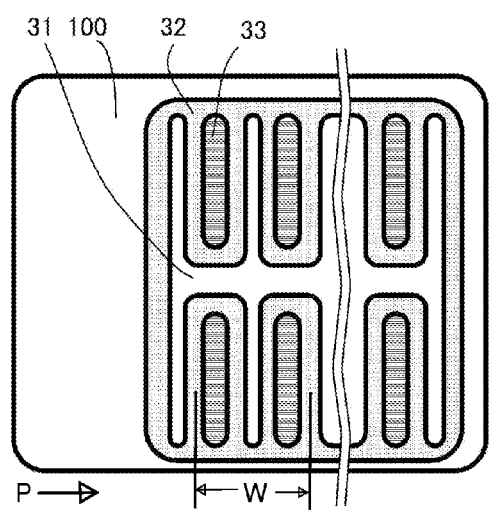

In FIG. 2A, a stripe form channel region 32 (a well region) is disposed on one main surface of the semiconductor substrate 31, while examples wherein a stripe form (i.e., a periodic sequence of stripes) emitter region 33 is disposed in a surface layer of the channel region 32 are shown in FIGS. 2B and 2C.

A collector region 38 is disposed on the other main surface of the semiconductor substrate 31, and a collector electrode 39 is disposed on the collector region 38.

A gate electrode 35 forms the gate 3 of the IGBT 1 of FIG. 1, and is connected via the gate wiring 23 to the gate terminal 26. The collector electrode 39 forms the collector 2, and is connected to the collector terminal 25. An emitter electrode 37 forms the emitter 4, and is connected to the emitter terminal 27. Also, the sense emitter 5 shown in FIG. 1 is omitted from FIG. 2A.

Figure 3:
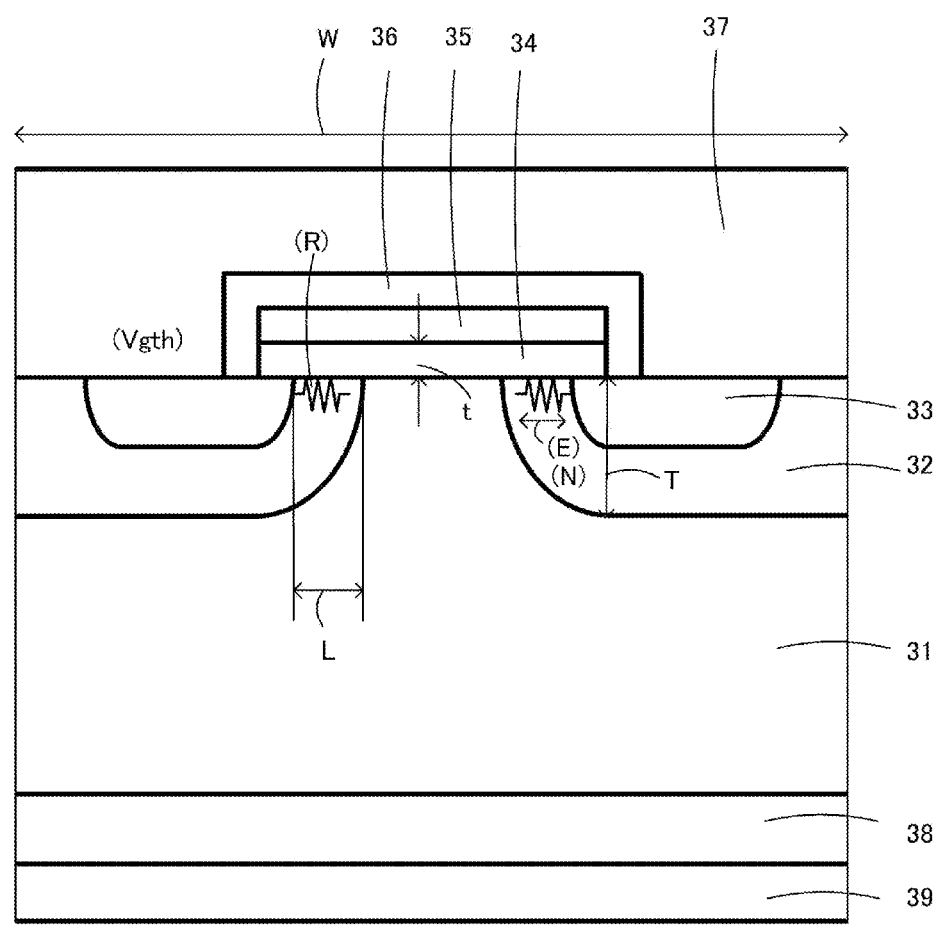
FIG. 3 is a diagram showing the reference sign given to each region in the vicinity of a channel region of the IGBT.

FIG. 3 is a diagram showing the reference sign given to each region in the vicinity of the channel region 32 of the IGBT 1. This diagram is the same as FIG. 2A.

A reference sign t is given to the thickness of a gate oxide film 34, a reference sign L to a channel length, which is the length of the channel formed in the channel region 32, a reference sign T to the diffusion depth of the channel region 32, and a reference sign W to a cell width (a cell being a group of adjacent stripes forming one period of a periodic sequence of stripes). In the diagram, the reference sign of the impurity concentration of the channel region 32 is N, the reference sign of the gate threshold voltage of the IGBT 1 is Vgth, the reference sign of the channel resistance is R, and a voltage drop caused by the channel resistance R is E, and these reference signs are shown in parentheses. Herein, a description will be given of the gate threshold voltage. The gate threshold voltage in the present application is, for example, the gate voltage when the current flowing through the emitter 4 reaches ¹⁄₁,₀₀₀ of a rated current when the gate voltage is increased from 0V while applying a voltage of several volts to the collector-emitter voltage. In addition, in a heretofore known DMOS structure, a gate voltage at which an electron inversion layer channel is formed in a place in a p-type base layer in contact with a MOS gate is also called a gate threshold. This heretofore known (i.e., gate voltage at which an electron inversion layer channel is formed) threshold voltage is determined by the impurity concentration of the p-type base layer and the thickness of the gate oxide film, and in the present application, in order to differentiate between meanings, the heretofore known gate threshold voltage (i.e., between the emitter 4 and the base layer) is called an effective gate threshold voltage.

Using FIG. 3, a description will be given of a measure for reducing the threshold voltage Vgth of the IGBT 1. As previously described, the required minimum operating voltage of the single chip igniter 100 is 1V. Because of this, it is necessary that the gate threshold voltage Vgth of the IGBT 1 is at most 1V.

According to a simulation, when the thickness t of the gate oxide film is 50 nm, it is necessary for the impurity concentration N of the channel region 32 to be $1 \times 10^{17}/cm^3$ in order for the gate threshold voltage Vgth of the IGBT 1 to be 1V. The thickness t of the gate oxide film 34 is a thickness such that dielectric breakdown does not occur at the voltage applied to the gate 3 when a surge voltage is applied to the gate terminal 26. Because of this, when it is possible to suppress the surge voltage applied to the gate terminal 26 by lowering the operating resistance of the surge protection Zener diode 19, it is possible to reduce the thickness t of the gate oxide film 34, and thus possible to reduce the gate threshold voltage Vgth.

It is good when the thickness t of the gate oxide film 34 is within a range of 5 nm to less than 25 nm. It is not desirable that the thickness t is less than 5 nm, as the probability of the gate oxide film 34 breaking down at the surge voltage increases. It is preferable that the thickness t of the gate oxide film 34 is 10 nm or more, as the probability of the gate oxide film 34 breaking down at the surge voltage is low. Meanwhile, when the thickness t exceeds 25 nm, it is difficult to reduce the gate threshold voltage Vgth to 1V, even when controlling the impurity concentration N of the channel region 32.

Also, by increasing the junction area of the surge protection Zener diode 19 by, for example, 10%, thereby reducing the operating resistance by 10%, it is possible to reduce the voltage applied to the gate 3 when the surge voltage is applied to the gate terminal 26 by several percent in comparison with the heretofore known voltage. As a result of this, it is possible to reduce the thickness t of the gate oxide film 34 by several percent in comparison with that heretofore known. As the gate threshold voltage Vgth is proportional to the thickness t of the gate oxide film 34, it is possible to reduce the gate threshold voltage Vgth by in the region of several percent by reducing the thickness t of the gate oxide film 34 by several percent. For example, it is possible to reduce the thickness t of the gate oxide film 34 by 5 to 15% in comparison with that heretofore known, because of which it is possible to reduce the gate threshold voltage Vgth by in the region of 25 to 75%.

Next, a description will be given of the relationship between the channel length L and the impurity concentration of the channel region 32.

When reducing the impurity concentration N ($\leq 10^{17}$ $cm^{-3}$) of the channel region 32, the channel resistance R increases, and the voltage drop E caused by the channel resistance R increases. When the voltage drop E increases, a problem occurs in that the on-state voltage of the IGBT increases. This is particularly so when the IGBT is caused to operate in the vicinity of the gate threshold voltage Vgth. Because of this, it is necessary to arrange so that the voltage drop E caused by the channel resistance R does not change, even when reducing the impurity concentration N of the channel region 32.

Next, a description will be given of the relationship between the impurity concentration N of the channel region 32 necessary for the gate threshold voltage Vgth to be 1V and the channel length L when the voltage drop E caused by the channel resistance R is kept constant (that is, when the channel resistance R is kept constant).

When reducing the impurity concentration N of the channel region 32 in order to reduce the gate threshold voltage Vgth, the channel resistance R increases, as previously described. In order to suppress this increase of the channel resistance R, it is necessary to shorten the channel length L. That is, it is necessary to optimize the mutually dependent channel region impurity concentration N and channel length L.

FIGS. 4A to 4D are diagrams showing relationships among the gate threshold voltage Vgth, the impurity concentration N of the channel region 32, the channel resistance R, and the channel length L. A, B, and so on in the diagrams indicate steps for optimizing the impurity concentration N of the channel region 32 and the channel length L.

Figure 4A:
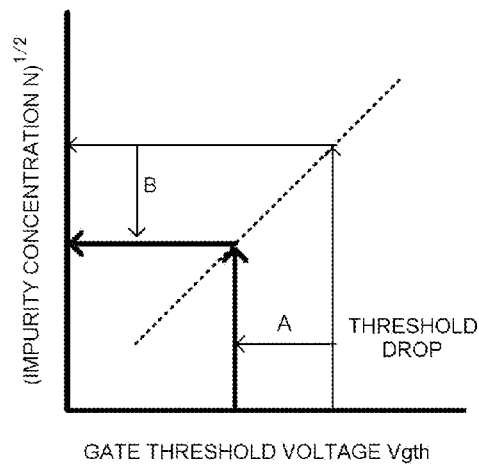
FIGS. 4A to 4D are diagrams showing relationships among a gate threshold voltage, an impurity concentration of the channel region, a channel resistance, and a channel length.
Figure 4B:
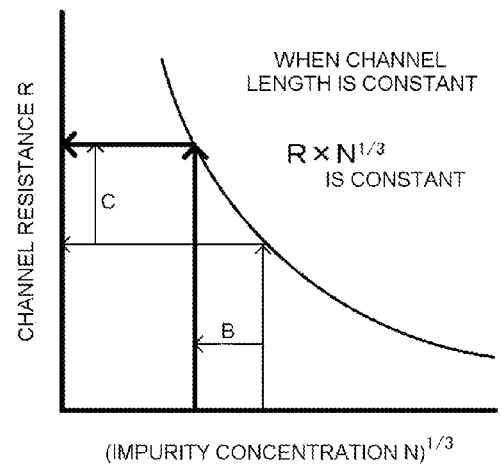
Figure 4C:
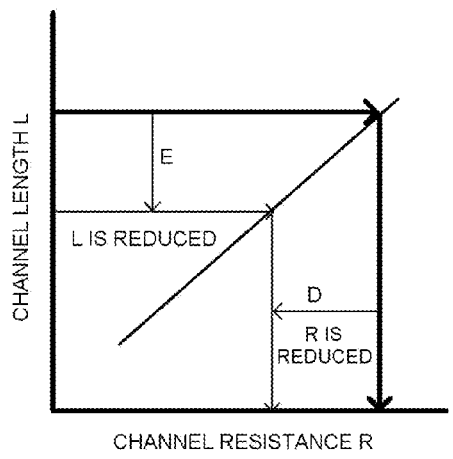
Figure 4D:
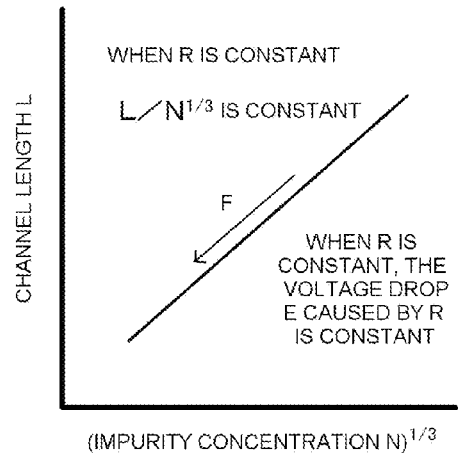

FIG. 4A is a diagram showing the relationship between the gate threshold voltage Vgth and the impurity concentration N of the channel region 32. A decrease in the gate threshold voltage Vgth (step A) is such that the decrease is in proportion to the square root of the impurity concentration N of the channel region 32 (step B). FIG. 4B is a diagram showing the relationship between the impurity concentration N of the channel region 32 and the channel resistance R, wherein the channel resistance R is such that, when the impurity concentration N of the channel region 32 is reduced (step B), the electron concentration in the channel decreases, and the amount of movement increases. These intertwine, and the channel resistance increases roughly in inverse proportion to the cubic root of the impurity concentration (step C). This is when the IGBT is caused to operate in the vicinity of the gate threshold voltage Vgth, which is the minimum operating voltage. FIG. 4C is a diagram showing the relationship between the channel length L and the channel resistance R, wherein the channel length L increases in proportion to a decrease in the channel resistance R. In order to reduce the channel resistance R to the original value (step D), it is necessary to shorten the channel length L (step E). FIG. 4D is a diagram showing the relationship between the impurity concentration N of the channel region 32 and the gate channel length L when the voltage drop E caused by the channel resistance R is kept constant. The channel length L decreases in proportion to the cubic root of the impurity concentration N of the channel region 32. By reducing the impurity concentration N of the channel region 32, it is possible to reduce the channel length L. By reducing the channel length L, it is possible to return the increased channel resistance R (the stage of step C) to the original value (step F). That is, by reducing the impurity concentration N of the channel region 32 and the channel length L, it is possible to reduce the gate threshold voltage Vgth to 1V, and to keep the channel resistance R constant.

However, as the channel length L depends on microfabrication accuracy, it is difficult in terms of processing for the channel length L to be made particularly short. Furthermore, when the impurity concentration N of the channel region 32 is low, the extension of a depletion layer spreading in the channel region 32 increases, and when the channel length L becomes too small, it is difficult to maintain the breakdown voltage of the IGBT 1. Because of this, it is not possible to lower the impurity concentration N of the channel region 32 to an extreme, thereby shortening the channel length L to an extreme.

The reciprocal relationships of the specifications shown in FIGS. 4A to 4D are estimates based on knowledge obtained from literature and experiment.

Next, when expressing the heretofore described details as a mathematical expression, they are expressed as below.

$$Vgth \propto \sqrt{N} \times t$$

$$R \propto 1/N^{1/3} (N \leq 10^{17} \text{ cm}^{-3}), E \propto R, R \propto L (N \leq 10^{17} \text{ cm}^{-3})$$

$$L/N^{1/3} \propto L \cdot R \propto R^2 \propto E^2$$

That is, $L/N^{1/3}$ is constant. Because of this, the relational expression $L=G \times N^{1/3}$ is established. Note that G is a proportionality constant, and is in the range of N $10^{17}$ cm$^{-3}$.

According to a simulation, when calculating the channel length L and the impurity concentration N of the channel region 32 with which the gate threshold voltage Vgth becomes 1V at the same channel resistance R as in a heretofore known element, the channel length L is 4 µm, while the impurity concentration N of the channel region 32 is $1 \times 10^{17}$ cm$^{-3}$.

When using these figures, it is good, in order to reduce the gate threshold voltage Vgth to 1V or less and reduce the voltage drop E caused by the channel resistance R to or below a heretofore known voltage drop, to determine the channel length L so that it comes within a range of channel length L (cm)$\leq 4 \times 10^{-4} \times (10^{-17})^{1/3} \times$(impurity concentration N of channel region 32 (cm$^{-3}$))$^{1/3}$ by reducing the impurity concentration N of the channel region 32, under conditions of impurity concentration N of channel region $32 \leq 10^{17}$ cm$^{-3}$, channel length L$\leq 4 \times 10^{-4}$ cm (=4 µm).

When fabricating a single chip igniter, the channel length L and the impurity concentration N of the channel region 32 are optimized while satisfying the expression above. However, as a high precision microfabrication is necessary for the channel length L, the channel length L may be fixed at a predetermined length meeting the above-mentioned conditions, and the impurity concentration N of the channel region 32 reduced.

In this case, however, the voltage drop E caused by the channel resistance R increases as the impurity concentration N of the channel region 32 is lowered. However, as the ratio of the voltage drop E caused by the channel resistance R at the on-state voltage of the IGBT is small, the rise of the on-state voltage is small.

The impurity concentration N of the channel region 32 shown here is the average impurity concentration with respect to the diffusion depth of the channel region 32. This is the value of the impurity dose of the channel region 32 divided by the diffusion depth T.

When the impurity concentration N of the channel region 32 is reduced and the channel length L shortened in order to reduce the gate threshold voltage Vgth, it is possible to reduce the cell size (possible to reduce the cell width W). As a result of this, the cell density increases, and it is possible to increase the conduction capability of the IGBT 1.

The cell density, when the cell is a cell of a stripe form, is the number of the stripe form channel regions 32 (well regions) in a perpendicular direction P (see FIGS. 2B and 2C) in a 1 cm length in the longitudinal direction of the cell.

Also, when the cell density increases, the operating resistance decreases owing to the I-V characteristics of the IGBT. Because of this, the on-state voltage at a predetermined current decreases, and the operation is apparently equivalent to that when the gate threshold voltage Vgth decreases. That is, by increasing the cell density, it is possible to apparently reduce the gate threshold voltage Vgth. This means that an advantage is obtained when increasing the cell density in comparison with that heretofore known, and specifically, in the case of a cell of a stripe form, when increasing the cell density to $1 \times 10^3$/cm or more.

Also, by using a material with permittivity higher than that of an oxide film as the material of a gate dielectric, it is possible to increase the gate capacitance, thus decreasing the gate threshold voltage Vgth.

Embodiment 2

Circuit

Figure 5:
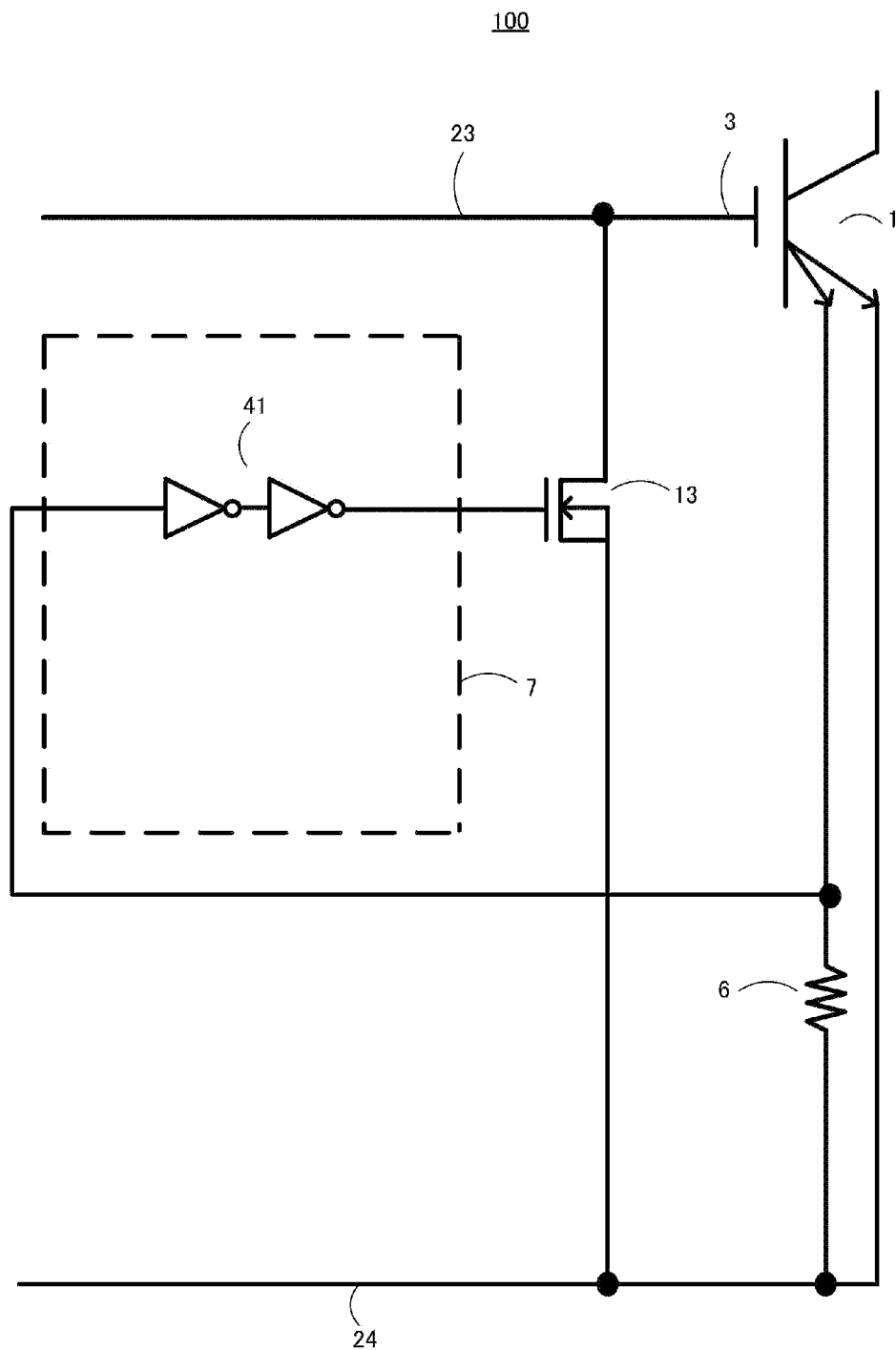
FIG. 5 is a main portion configuration diagram of the single chip igniter used in an internal combustion engine ignition device according to a second embodiment of the invention.

FIG. 5 is a main portion configuration diagram of the single chip igniter 100 used in an internal combustion engine ignition device according to a second embodiment of the invention. The diagram is a main portion circuit diagram of the current limiter circuit 7 configuring the single chip igniter 100.

To reduce the operating voltages of the current limiter circuit 7 and the unshown overheat detector circuit 10, it is necessary to reduce the gate thresholds of MOSFETs (n-type MOS) configuring the circuits 7 and 10. A measure for doing so is the same as the measure employed for the IGBT 1.

Also, it is possible to reduce the operating voltage by adjusting the circuit configuration. An example thereof will be described using the current limiter circuit 7.

Figure 6A:
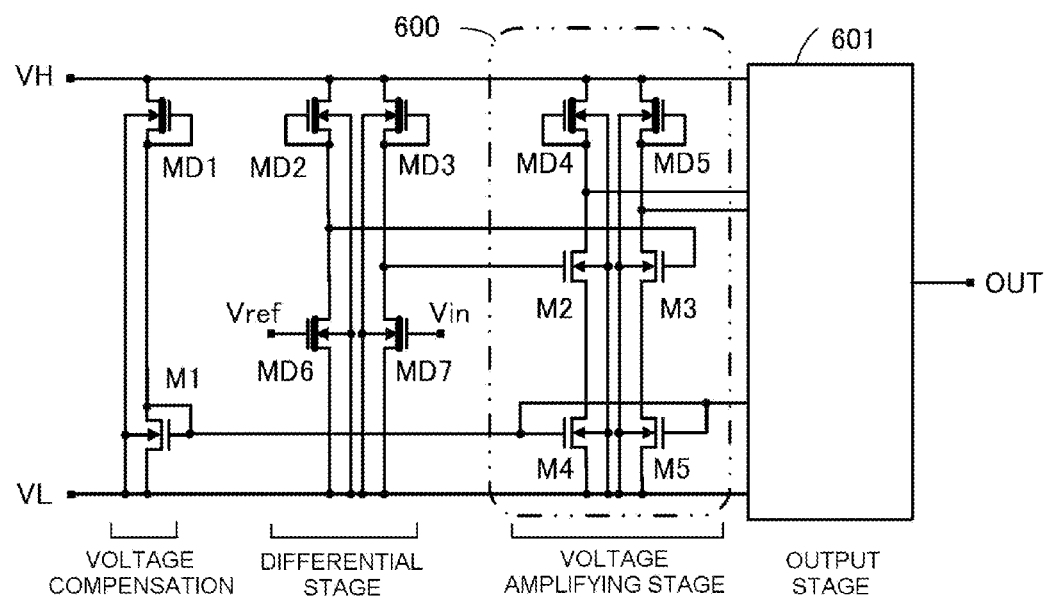
Figure 6B:
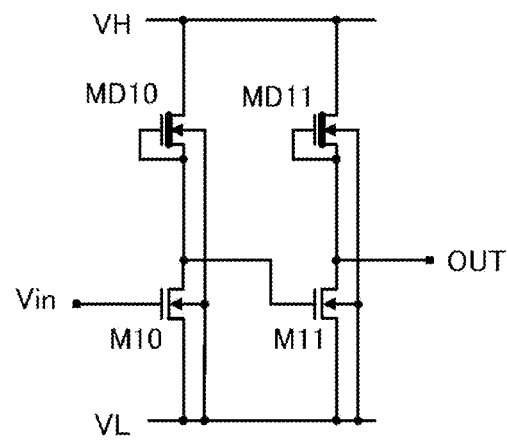
FIG. 6B shows a configuration of embodiments of the invention.

A heretofore known current limiter circuit 57 shown in FIG. 9 is formed using an operational amplifier configured of an n-type MOS circuit of a serial three-stage configuration, as shown in FIG. 6A. Specifically, a circuit configured of a three-stage configuration n-type MOS circuit is a voltage amplifier stage 600. Herein, VH indicates the high voltage side of a power supply, and VL is the low voltage side of the power supply. Vin is an input voltage terminal, and Vref is a reference voltage input terminal. Elements indicated by "MD" and a numeral are depression MOSFETs, while elements indicated simply by "M" and a numeral are enhancement MOSFETs. By changing this to an inverter circuit 41 of a serial two-stage configuration, as in the current limiter circuit 7 shown in FIG. 5, it is possible to reduce the minimum operating voltage of the current limiter circuit 7 to 1V or less. This is because each inverter in the inverter circuit 41 is configured of an n-type MOS of a serial two-stage configuration (an upper stage n-type MOS is used as a resistor wherein the gate and source are short-circuited). A specific circuit wherein the n-type MOS is of a two-stage configuration is shown in FIG. 6B. Also, the inverter circuit can also be formed by a resistor and n-type MOS being connected in series. Herein, the n-type MOS being an n-channel MOSFET, the operating voltage of the n-type MOS can be reduced to in the region of 0.7V or less per element by reducing the gate threshold voltage. When the power supply voltage is 2V, it is desirable that the MOSFET threshold is between 0.7V and 2V, and as near to 0.7V as possible.

Also, in the case of the overheat detector circuit 10 too, it is possible to reduce the minimum operating voltage to 1V or less, in the same way as in the current limiter circuit 7, by applying the two-stage inverter circuit 41 as in FIG. 5.

A description will be given of one example of a method of manufacturing the single chip igniter 100 of FIG. 5.

Firstly, a plurality of combinations of the two-stage inverter circuit 41 configuring the current limiter circuit 7 and overheat detector circuit 10 are formed in each of the circuits 7 and 10 on the semiconductor substrate 31 on which the IGBT 1, or the like, is formed.

Next, the voltage (sense signal) generated by the sense resistor 5 or the detection voltage (diode forward voltage drop) generated by the detection of an overheat is compared in a wafer tester with the characteristics of each two-stage inverter circuit 41 of the plurality of combinations formed in the current limiter circuit 7 and overheat detector circuit 10, and each two-stage inverter circuit 41 is selected at an optimum combination. The selection method is accomplished by a large number of the two-stage inverter circuit 41, or specifically, the kind of circuit shown in FIG. 6B configuring the inverter circuit, being formed in parallel in a condition wherein, for example, the ground side wiring is not connected, a circuit with appropriate characteristics being selected from among the large number, and the ground side wiring being connected to the selected circuit. The large number of circuits formed in a condition wherein the ground side wiring is not connected may also be of a configuration such that the ground side wiring is connected in advance, but the power supply side is not connected.

Because of this, it is possible to form the current limiter circuit 7 and overheat detector circuit 10 to have a minimum operating voltage of 1V or less with high accuracy.

Embodiment 3

Noise Countermeasure and Surge Protection

Figure 7:
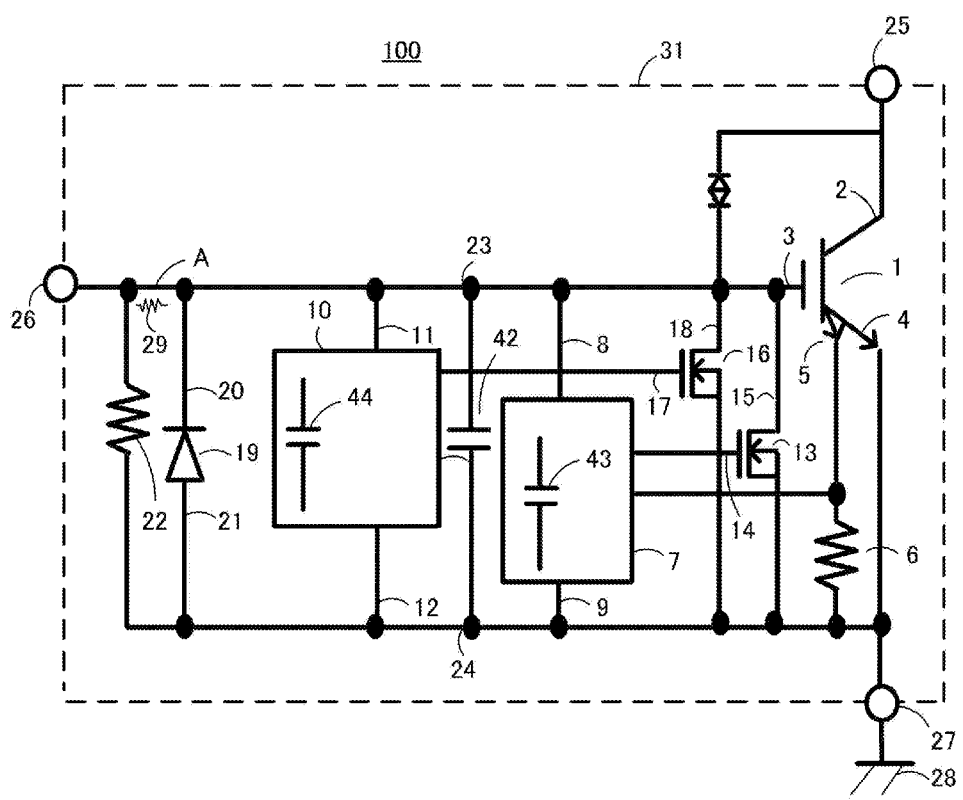
FIG. 7 is a main portion configuration diagram of the single chip igniter used in an internal combustion engine ignition device according to a third embodiment of the invention.
Figure 8:
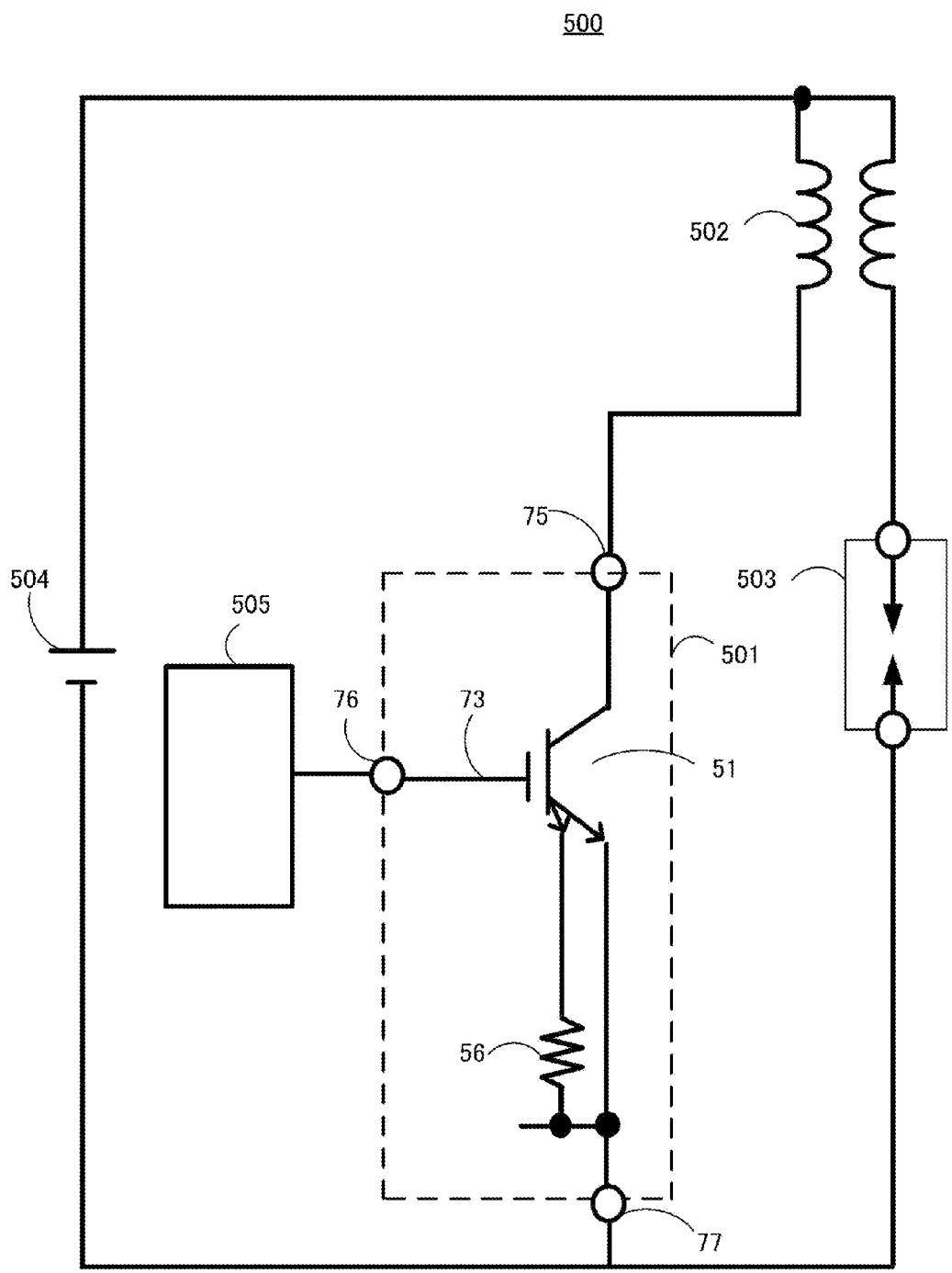
FIG. 8 is a main portion configuration diagram of an internal combustion engine ignition device in which is mounted a heretofore known single chip igniter.

FIG. 7 is a main portion configuration diagram of the single chip igniter 100 used in an internal combustion engine ignition device according to a third embodiment of the invention.

In FIG. 7, a capacitor 42 is connected between the gate wiring 23 and ground wiring 24. Installing the capacitor 42 has the result that, even when noise of negative polarity is superimposed in a condition in which the gate voltage input into the gate terminal 26 is reduced to 1.5V, which is the minimum operating voltage, a drop in the gate voltage is prevented by the capacitor voltage. As a result of this, it is possible to cause the current limiter circuit 7, overheat detector circuit 10, and IGBT 1 to operate stably. That is, by installing the capacitor 42, it is possible to increase the noise tolerance of the single chip igniter 100.

Also, there is the same advantage when providing capacitors 43 and 44 in the current limiter circuit 7 and overheat detector circuit 10 respectively. In order to increase the noise tolerance of, for example, two-stage configuration MOSFET circuits that detect current or heat in the current limiter circuit 7 and overheat detector circuit 10, these capacitors are installed in the immediate vicinity of the same n-type MOS circuit. Specifically, a capacitor is installed between the power supply and the ground, between Vin and the ground, and between the gate of M11 and the ground in, for example, FIG. 6B. By installing capacitors in this way, there is an advantage in that the MOSFET junction capacity is increased, and it is thus possible to increase noise tolerance.

resistor 29 is disposed at a portion A in order to suppress a surge voltage at date terminal 26. As the surge voltage is divided between the inserted resistor 29 and Zener diode 19, and the divided voltage is applied to the gate of the IGBT 1, it is possible to suppress the surge voltage by installing the resistor 29. However, as the resistor 29 is disposed in series in the gate wiring 23, the gate voltage input into the gate terminal 26 is low at the point at which it reaches the gate of the IGBT 1. Because of this, it is necessary for the resistor 29 to be as small as possible to suppress decay of the gate voltage input into the gate terminal 26.

The capacitor 42 works in the same way as a snubber capacitor, and has an advantage of suppressing surge voltage. Because of this, it is possible to reduce the resistance of the resistor 29 installed in the portion A by using the capacitor 42. In FIG. 7, a bidirectional diode inserted between the collector 2 of the IGBT and the gate wiring 23 is a simplified depiction of a plurality of diodes connected in series.

By combining Embodiments 1 to 3, the single chip igniter 100 operates stably even when the gate voltage input into the gate terminal 26 is reduced, and furthermore, it is possible to improve noise tolerance, and the conduction capability of the IGBT 1 is sufficiently maintained even when operating at a low gate voltage.

Furthermore, it is possible to achieve a reduction in package size and a reduction in cost in comparison with a hybrid igniter.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2012-149811, filed on Jul. 3, 2012, Japanese Patent Application No. 2012-149812, filed on Jul. 3, 2012, and Japanese Patent Application No. 2012-149813, filed on Jul. 3, 2012. The disclosures of the priority applications, in their entirety, including the drawings, claims, and the specifications thereof, are incorporated herein by reference.

What is claimed is:

1. A single chip igniter, comprising:
   a MOS transistor;
   a gate terminal electrically connected to the gate of the MOS transistor; and
   a control circuit that limits the gate voltage of the MOS transistor, all disposed on the same semiconductor substrate, wherein an input voltage into the gate terminal of the single chip igniter is the power supply voltage of the control circuit and a control signal of the MOS transistor, the minimum value of the input voltage is less than 3.5V, and wherein the effective gate threshold voltage of the MOS transistor configuring the single chip igniter is 1V or less, and when the channel length of the MOS transistor configuring the single chip igniter is L (cm) and the impurity concentration per unit volume of the channel region of the MOS transistor is N (cm$^{-3}$), L≤4×10$^{-4}$×(10$^{-17}$)$^{1/3}$×N$^{1/3}$.

2. The single chip igniter according to claim 1, wherein the minimum value of the input voltage is less than 2.5V.

3. The single chip igniter according to claim 1, wherein the minimum value of the input voltage is less than 2.0V.

4. The single chip igniter according to claim 1, wherein the channel length of the MOS transistor is 4 μm or less.

5. The single chip igniter according to claim 1, wherein the thickness of a gate oxide film of the MOS transistor is 5 nm or more, 25 nm or less.

6. The single chip igniter according to claim 1, wherein, when a cell of the MOS transistor is of a stripe form, the density of cells in a direction perpendicular to the longitudinal axes of the stripes is 5×10$^2$ per cm or more.

7. The single chip igniter according to claim 1, wherein the MOS transistor configuring the single chip igniter is of a planar gate structure or a trench structure.

8. The single chip igniter according to claim 1, wherein the control circuit is one or a plurality of circuits selected from a current limiter circuit, an overheat detector circuit, a timer circuit, an overvoltage protection circuit, and an input hysteresis circuit.

9. The single chip igniter according to claim 1, wherein the MOS transistor is an insulated gate bipolar transistor.

10. An internal combustion engine ignition device using the single chip igniter according to claim 1.

11. A single chip igniter, comprising:
a MOS transistor;
a gate terminal electrically connected to the gate of the MOS transistor; and
a control circuit that limits the gate voltage of the MOS transistor,
all disposed on the same semiconductor substrate, wherein
an input voltage input into the gate terminal of the single chip igniter becomes the power supply voltage of the control circuit and a control signal of the MOS transistor, and the minimum value of the input voltage is less than 3.5V, and wherein,
when the channel length of the MOS transistor configuring the single chip igniter is L (cm) and the impurity concentration per unit volume of the channel region of the MOS transistor is N (cm$^{-3}$), L≤4×10$^{-4}$×(10$^{-17}$)$^{1/3}$×N$^{1/3}$.

12. A single chip igniter, comprising:
a MOS transistor;
a gate terminal electrically connected to the gate of the MOS transistor; and
a control circuit that limits the gate voltage of the MOS transistor,
all disposed on the same semiconductor substrate, wherein an input voltage into the gate terminal of the single chip igniter is the power supply voltage of the control circuit and a control signal of the MOS transistor, the minimum value of the input voltage is less than 3.5V, the minimum operating voltage of the control circuit is 1.5V or less, and the control circuit is configured of two inverter circuits "configured of two MOSFET stages connected in series, and wherein the effective gate threshold voltage of the MOS transistor configuring the single chip igniter is 1V or less, and when the channel length of the MOS transistor configuring the single chip igniter is L (cm) and the impurity concentration per unit volume of the channel region of the MOS transistor is N (cm$^{-3}$), L≤4×10$^{-4}$×(10$^{-17}$)$^{1/3}$×N$^{1/3}$.

13. The single chip igniter according to claim 12, wherein the minimum value of the input voltage is less than 2.5V.

14. The single chip igniter according to claim 12, wherein the minimum value of the input voltage is less than 2.0V.

15. The single chip igniter according to claim 12, wherein the channel length of the MOS transistor is 4 μm or less.

16. The single chip igniter according to claim 12, wherein the effective gate threshold voltage of the MOS transistor configuring the single chip igniter is 1.5V or less, and the thickness of a gate oxide film of the MOS transistor is 5 nm or more, 25 nm or less.

17. The single chip igniter according to claim 12, wherein, when a cell of the MOS transistor is of a stripe form, the density of cells in a direction perpendicular to the longitudinal axes of the stripes is 5×10$^2$ per cm or more.

18. The single chip igniter according to claim 12, wherein the MOS transistor configuring the single chip igniter is of a planar gate structure or a trench structure.

19. The single chip igniter according to claim 12, wherein the minimum operating voltage of the control circuit is 1V or more, and the control circuit is configured of a two-stage inverter circuit.

20. The single chip igniter according to claim 12, wherein the control circuit is one or a plurality of circuits selected from a current limiter circuit, an overheat detector circuit, a timer circuit, an overvoltage protection circuit, and an input hysteresis circuit.

21. The single chip igniter according to claim 12, wherein the MOS transistor is an insulated gate bipolar transistor.

22. An internal combustion engine ignition device using the single chip igniter according to claim 12.

23. A single chip igniter, comprising:
a MOS transistor;
a gate terminal electrically connected to the gate of the MOS transistor; and
a control circuit that limits the gate voltage of the MOS transistor,
all disposed on the same semiconductor substrate, wherein
an input voltage into the gate terminal of the single chip igniter is the power supply voltage of the control circuit and a control signal of the MOS transistor, the minimum value of the input voltage is less than 3.5V,
the minimum operating voltage of the control circuit is 1.5V or less, and the control circuit is configured of two inverter circuits configured of two MOSFET stages connected in series, and
wherein,
when the channel length of the MOS transistor configuring the single chip igniter is L (cm) and the impurity concentration per unit volume of the channel region of the MOS transistor is N (cm$^{-3}$), L≤4×10$^{-4}$×(10$^{-17}$)$^{1/3}$×N$^{1/3}$.

24. A single chip igniter, comprising:
a MOS transistor;
a gate terminal electrically connected to a gate of the MOS transistor; and
a control circuit that limits the gate voltage of the MOS transistor, the control circuit including a first capacitor, all disposed on the same semiconductor substrate, wherein
an input voltage into the gate terminal of the single chip igniter is the power supply voltage of the control circuit and a control signal of the MOS transistor, the minimum value of the input voltage is less than 3.5V, and
a first side of a second capacitor is connected to gate wiring, the gate wiring connected to the gate terminal via a resistor and directly connected to the gate of the MOS transistor, and a second side of the second capacitor is connected to the ground,
wherein,
when the channel length of the MOS transistor configuring the single chip igniter is L (cm) and the impurity concentration per unit volume of the channel region of the MOS transistor is N (cm$^{-3}$), L≤4×10$^{-4}$×(10$^{-17}$)$^{1/3}$×N$^{1/3}$.

25. The single chip igniter according to claim 24, wherein the minimum value of the input voltage is less than 2.5V.

26. The single chip igniter according to claim 24, wherein the minimum value of the input voltage is less than 2.0V.

27. The single chip igniter according to claim 24, wherein the effective gate threshold voltage of the MOS transistor configuring the single chip igniter is 1V or less, and the impurity dose per unit volume of a channel region of the MOS transistor is 1×10$^{17}$/cm$^3$ or less.

28. The single chip igniter according to claim 24, wherein the effective gate threshold voltage of the MOS transistor configuring the single chip igniter is 1V or less, and the channel length of the MOS transistor is 4 µm or less.

29. The single chip igniter according to claim 24, wherein the effective gate threshold voltage of the MOS transistor configuring the single chip igniter is 1V or less, and the thickness of a gate oxide film of the MOS transistor is 5 nm or more, 25 nm or less.

30. The single chip igniter according to claim 24, wherein the effective gate threshold voltage of the MOS transistor configuring the single chip igniter is 1V or less and, when a cell of the MOS transistor is of a stripe form, the density of cells in a direction perpendicular to the longitudinal axes of the stripes is 5×10$^2$ per cm or more.

31. The single chip igniter according to claim 24, wherein the MOS transistor configuring the single chip igniter is of a planar gate structure or a trench structure.

32. The single chip igniter according to claim 24, wherein capacitors are connected between the high potential side of the control circuit power supply and the ground.

33. The single chip igniter according to claim 24, wherein the minimum operating voltage of the control circuit is 1V or more, and the control circuit is configured of two serially connected MOSFET inverting stages.

34. The single chip igniter according to claim 24, wherein the control circuit is a current limiter circuit, an overheat detector circuit, or both the current limiter circuit and the overheat detector circuit.

35. The single chip igniter according to claim 24, wherein the MOS transistor is an insulated gate bipolar transistor.

36. An internal combustion engine ignition device using the single chip igniter according to claim 24.

37. A single chip igniter, comprising:
a MOS transistor;
a gate terminal electrically connected to the gate of the MOS transistor; and
a control circuit that limits the gate voltage of the MOS transistor,
all disposed on the same semiconductor substrate, wherein
an input voltage into the gate terminal of the single chip igniter is the power supply voltage of the control circuit and a control signal of the MOS transistor, the minimum value of the input voltage is less than 3.5V, and
a capacitor is connected between gate wiring connecting the gate terminal configuring the single chip igniter and the gate of the MOS transistor and the ground,
wherein,
when the channel length of the MOS transistor configuring the single chip igniter is L (cm) and the impurity concentration per unit volume of the channel region of the MOS transistor is N (cm$^{-3}$), L≤4×10$^{-4}$×(10$^{-17}$)$^{1/3}$×N$^{1/3}$.

* * * * *